United States Patent
Yang et al.

(10) Patent No.: US 9,112,188 B2
(45) Date of Patent: Aug. 18, 2015

(54) METHOD OF MANUFACTURING CAPACITOR, METHOD OF MANUFACTURING ORGANIC LIGHT EMITTING DISPLAY DEVICE INCLUDING THE CAPACITOR, AND ORGANIC LIGHT EMITTING DISPLAY DEVICE MANUFACTURED BY USING THE METHOD

(71) Applicant: Samsung Display Co., Ltd., Yongin, Gyeonggi-Do (KR)

(72) Inventors: Hui-Won Yang, Yongin (KR); Chaun-Gi Choi, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/059,857

(22) Filed: Oct. 22, 2013

(65) Prior Publication Data
US 2014/0326963 A1  Nov. 6, 2014

(30) Foreign Application Priority Data
May 6, 2013 (KR) .................... 10-2013-0050806

(51) Int. Cl.
*H01L 51/56* (2006.01)
*H01L 27/32* (2006.01)

(52) U.S. Cl.
CPC ............ *H01L 51/56* (2013.01); *H01L 27/3265* (2013.01)

(58) Field of Classification Search
CPC ...................................................... H01L 27/32
USPC ....................................................... 257/40, 43
See application file for complete search history.

(56) References Cited

U.S. PATENT DOCUMENTS

| | | | |
|---|---|---|---|
| 2006/0050191 A1 | 3/2006 | Park et al. | |
| 2010/0033087 A1* | 2/2010 | Kim et al. | 313/504 |
| 2011/0104833 A1* | 5/2011 | Kang et al. | 438/23 |
| 2012/0001191 A1 | 1/2012 | Ma et al. | |
| 2012/0138936 A1* | 6/2012 | Lee et al. | 257/59 |
| 2013/0126859 A1* | 5/2013 | Yeh et al. | 257/43 |

FOREIGN PATENT DOCUMENTS

| KR | 1020060023420 A | 3/2006 |
|---|---|---|
| KR | 1020090044471 A | 5/2009 |
| KR | 1020120002759 A | 1/2012 |

* cited by examiner

*Primary Examiner* — Steven Loke
*Assistant Examiner* — Arash Majdi
(74) *Attorney, Agent, or Firm* — Cantor Colburn LLP

(57) ABSTRACT

A method of manufacturing an organic light emitting display device includes: providing a capacitor on a substrate; providing a protection layer on the capacitor; providing an organic light emitting diode on the protection layer; and providing an encapsulation layer which encapsulates the organic light emitting diode. The providing the capacitor includes: providing a bottom electrode including an oxide semiconductor, on the substrate; providing an insulation layer on the substrate and overlapping the bottom electrode; annealing the bottom electrode to increase a carrier density of the bottom electrode; and providing an intermediate electrode on the insulation layer and overlapping the bottom electrode.

8 Claims, 6 Drawing Sheets

METHOD OF MANUFACTURING CAPACITOR, METHOD OF MANUFACTURING ORGANIC LIGHT EMITTING DISPLAY DEVICE INCLUDING THE CAPACITOR, AND ORGANIC LIGHT EMITTING DISPLAY DEVICE MANUFACTURED BY USING THE METHOD

This application claims priority to Korean Patent Application No. 10-2013-0050806, filed on May 6, 2013, and all the benefits accruing therefrom under 35 U.S.C. §119, the disclosure of which is incorporated herein in its entirety by reference.

BACKGROUND

1. Field

The invention relates to a method of manufacturing a capacitor including an electrode including an oxide semiconductor, a method of manufacturing an organic light emitting display device including the capacitor, and an organic light emitting display device manufactured by using the method.

2. Description of the Related Art

A flat panel display device such as an organic light emitting display device or a liquid crystal display ("LCD") device includes a thin film transistor ("TFT") for driving the display device, on a substrate, a capacitor or the like, and a conductive pattern including a wiring for connecting the TFT and the capacitor. The TFT includes an active layer providing a channel area of the TFT, a source area, a drain area, and a gate electrode on the channel area and electrically connected to the active layer via an opening defined in a gate insulation layer.

SUMMARY

The invention provides a method of manufacturing a capacitor which includes an electrode including an oxide semiconductor, by increasing a carrier density of the oxide semiconductor through annealing, and a method of manufacturing an organic light emitting display device including the capacitor.

According to an exemplary embodiment of the invention, there is provided a method of manufacturing an organic light emitting display device, the method including: providing a capacitor on a substrate; providing a protection layer on the capacitor; providing an organic light emitting diode on the protection layer; and providing an encapsulation layer which encapsulates the organic light emitting diode. The providing the capacitor includes: providing a bottom electrode including an oxide semiconductor, on the substrate; providing an insulation layer on the substrate and overlapping the bottom electrode; annealing the bottom electrode to increase a carrier density of the bottom electrode; and providing an intermediate electrode on the insulation layer and overlapping the bottom electrode.

The annealing the bottom electrode may diffuse hydrogen of the insulation layer into the bottom electrode to increase the carrier density of the bottom electrode.

The insulation layer may include SiNx.

The providing the insulation layer may include providing a plurality of insulation layers including a first insulation layer including SiNx; and a second insulation layer including one selected from $SiO_2$, $Al_2O_3$, $CuOx$, $Tb_4O_7$, $Y_2O_3$, $Nb_2O_5$ and $Pr_2O_3$, and a combination thereof.

The providing the capacitor may further include, after the providing the intermediate electrode: providing a top electrode overlapping the intermediate electrode; and providing an interlayer insulation layer between the intermediate electrode and the top electrode.

The capacitor may include a first sub-capacitor formed by the bottom electrode and the intermediate electrode, and a second sub-capacitor formed by the intermediate electrode and the top electrode.

The providing the bottom electrode of the capacitor may include forming an oxide semiconductor active layer of a thin film transistor ("TFT").

The annealing the bottom electrode of the capacitor may increase a carrier density of a portion of the oxide semiconductor active layer of the TFT.

The providing the intermediate electrode of the capacitor may include forming a gate electrode of a TFT.

The providing the top electrode of the capacitor may include forming source and drain electrodes of a TFT.

According to another exemplary embodiment of the invention, there is provided an organic light emitting display device including: a TFT including an oxide semiconductor active layer, a gate electrode, a source electrode and a drain electrode; a capacitor including: a bottom electrode including an oxide semiconductor, on a substrate; an intermediate electrode on the substrate and overlapping the bottom electrode; and an insulation layer between the bottom electrode and the intermediate electrode; and an organic light emitting diode including a pixel electrode, an organic emissive layer and an opposite electrode. A carrier density of the bottom electrode, is higher than that of the oxide semiconductor active layer.

The higher carrier density of the bottom electrode may be defined by diffused hydrogen of the insulation layer, in the bottom electrode.

The insulation layer may include SiNx.

The organic light emitting display device may further include a plurality of insulation layers between the oxide semiconductor bottom electrode and the intermediate electrode, and including: a first insulation layer including SiNx; and a second insulation layer including one selected from $SiO_2$, $Al_2O_3$, $CuOx$, $Tb_4O_7$, $Y_2O_3$, $Nb_2O_5$ and $Pr_2O_3$, and a combination thereof.

The capacitor may further include: a top electrode on the substrate and overlapping the intermediate electrode; and an interlayer insulation layer between the intermediate electrode and the top electrode.

The capacitor may further include a first sub-capacitor formed by the bottom electrode and the intermediate electrode, and a second sub-capacitor formed by the intermediate electrode and the sub-top electrode.

The bottom electrode of the capacitor may be in a same layer as and include a same material as the oxide semiconductor active layer of the TFT.

The carrier density of the bottom electrode of the capacitor and a carrier density of a portion of the oxide semiconductor active layer of the TFT, may be higher than that of a remaining portion of the oxide semiconductor active layer of the TFT.

The intermediate electrode of the capacitor may be in a same layer as and include a same material as the gate electrode of the TFT.

The top electrode of the capacitor may be in a same layer as and include a same material as the source and drain electrodes of the TFT.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

Figure 1:
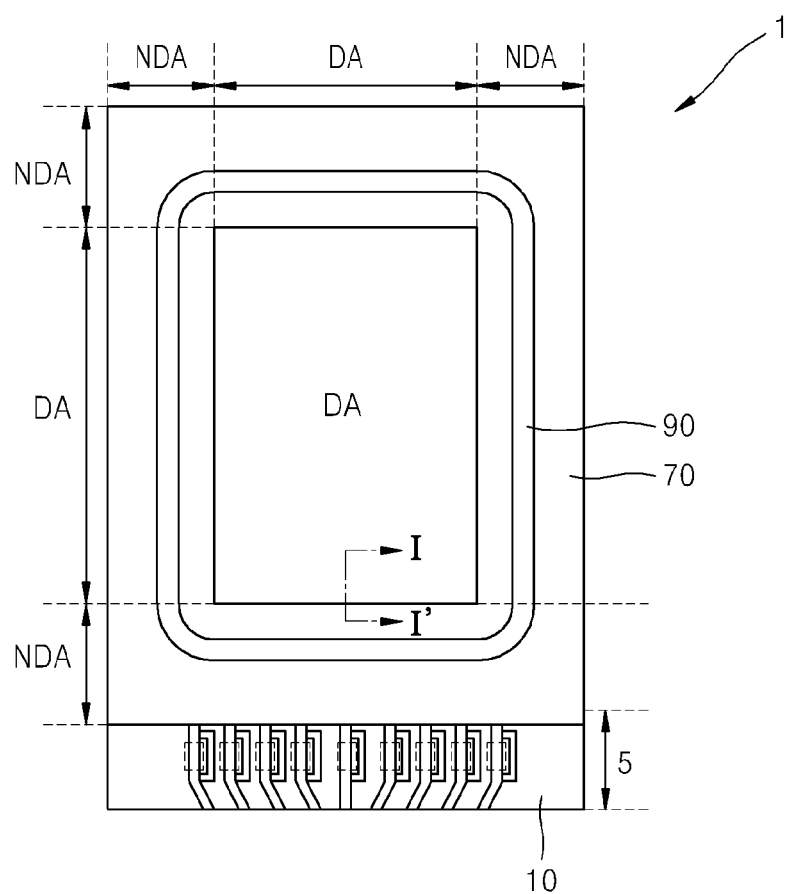
FIG. 1 is a schematic plan view illustrating an exemplary embodiment of an organic light emitting display device according to the invention.

The invention will now be described more fully with reference to the accompanying drawings, in which exemplary embodiments of the invention are shown. The embodiments will be described in detail such that one of ordinary skill in the art may easily work the invention. It should be understood that the embodiments of the invention may vary but do not have to be mutually exclusive. For example, particular shapes, structures and properties according to a predetermined embodiment described in this specification may be modified in other embodiments without departing from the spirit and scope of the invention. In addition, positions or arrangement of individual components of each of the embodiments may also be modified without departing from the spirit and scope of the invention. Accordingly, the detailed description below should not be construed as having limited meanings but construed to encompass the scope of the claims and any equivalent ranges thereto. In the drawings, like reference numerals denote like elements in various aspects.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "below," "above," and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the invention (especially in the context of the following claims) are to be construed to cover both the singular and the plural. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Furthermore, recitation of ranges of values herein are merely intended to serve as a shorthand method of referring individually to each separate value falling within the range, unless otherwise indicated herein, and each separate value is incorporated into the specification as if it were individually recited herein.

The methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to those of ordinary skill in this art without departing from the spirit and scope of the invention.

As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical."

Hereinafter, the invention will be described in detail with reference to the accompanying drawings.

A display device may include an active layer which provides a channel area of a thin film transistor ("TFT"). The active layer of the TFT may include a semiconductor material such as amorphous silicon or poly-silicon. When the active layer includes amorphous silicon, mobility thereof is relatively low and thus a display device driving circuit that operates at a high speed may be difficult to provide. In contrast, when the active layer includes poly-silicon, mobility thereof is relatively high but a threshold voltage thereof is not uniform and thus the display device may include an additional compensation circuit owing to the non-uniform threshold voltage.

In addition, a method of manufacturing a TFT by using a low temperature poly-silicon ("LTPS") may include relatively expensive processes such as laser annealing. Thus, a cost of equipment and management thereof is high, and applying the method to large display device substrates is difficult. To solve this problem, research into using an oxide semiconductor as an active layer is being actively conducted.

An organic light emitting display device having a top-gate structure may include an oxide semiconductor as an electrode of a capacitor. However, capacitance of the capacitor may undesirably vary according to a gate bias, and using the capacitor as a storage capacitor which is necessary when actually driving a display device display panel may be difficult. Therefore, there remains a need for an improved capacitor providing a uniform capacitance.

FIG. 1 is a schematic plan view illustrating an exemplary embodiment of an organic light emitting display device 1 according to the invention.

Referring to FIG. 1, the organic light emitting display device 1 includes a first substrate 10 and a second substrate 70 coupled to the first substrate 10, such as by a sealing member disposed therebetween.

A TFT, a light emitting element, a capacitor, or the like may be disposed on the first substrate 10. Also, the first substrate 10 may be a LTPS (e.g., crystalline silicon) substrate, a glass substrate or a plastic substrate.

The second substrate 70 may be referred to as an encapsulation substrate disposed on the first substrate 10 in order to protect a TFT and a light emitting element disposed on the first substrate 10 from inflow of external moisture, air, etc. The second substrate 70 may be disposed to face the first substrate 10. The first substrate 10 and the second substrate 70 are bonded to each other by using a sealing member 90 elongated along edges of the second substrate 70. The second substrate 70 may be a glass substrate, a plastic substrate or a stainless using steel ("SUS") substrate.

Although not shown in FIG. 1, an encapsulation film (not shown) of the second substrate 70 may be disposed on the first substrate 10 to encapsulate a light emission area, thereby protecting the light emission area from the external moisture and air. In one exemplary embodiment, for example, the encapsulation film may have a structure in which a layer including an inorganic material such as a silicon oxide or a silicon nitride and a layer including an organic material such as polyimide, are alternated. Alternatively, the encapsulation film may have a monolayer structure including a low-melting glass such as a tin oxide (SnO). However, the encapsulation film is not limited thereto, and a number of thin film encapsulation structures may be used as the encapsulation film, so long as such structure protects the light emission area from the external moisture and air.

The first substrate 10 includes a light emission area DA from which light is emitted, and a non-light emission area NDA disposed along an outer portion of the light emission area DA. According to exemplary embodiments of the invention, the sealing member 90 is disposed in the non-light emission area NDA on the outer portion of the light emission area DA, thereby bonding the first substrate 10 and the second substrate 70 to each other.

As described above, a light emitting element, a TFT for driving the light emitting element, and wirings electrically connected thereto are disposed in the light emission area DA of the first substrate 10. The organic light emitting display device 1 may also include a pad area 5 in the non-light emission area NDA. The pad area 5 may include a pad electrode extending from the wirings of the light emission area DA. Hereinafter, the description will focus on a cross-section of the light emission area DA of the organic light emitting display device 1 taken along line I-I'.

Figure 2:
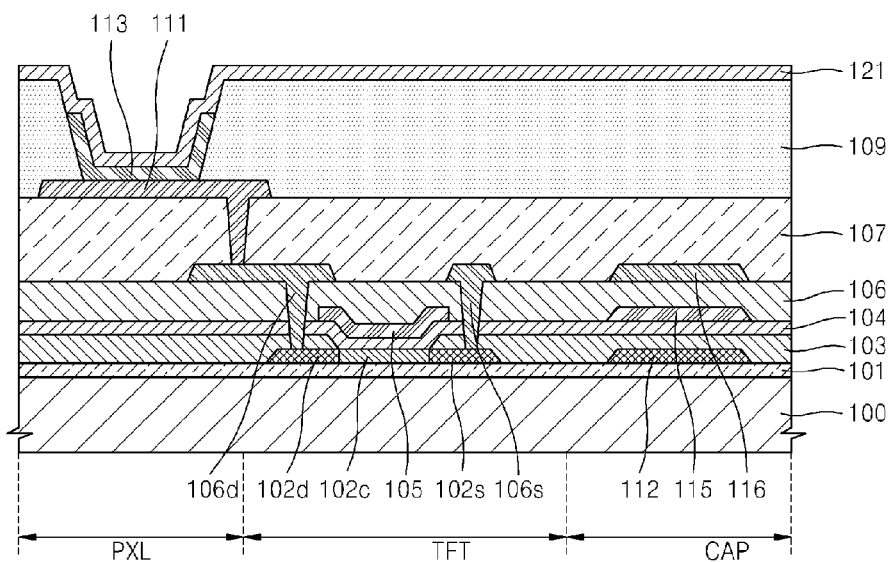
FIG. 2 is an enlarged cross-sectional view of the organic light emitting display device of FIG. 1 taken along line I-I' according to the invention.
Figure 3:
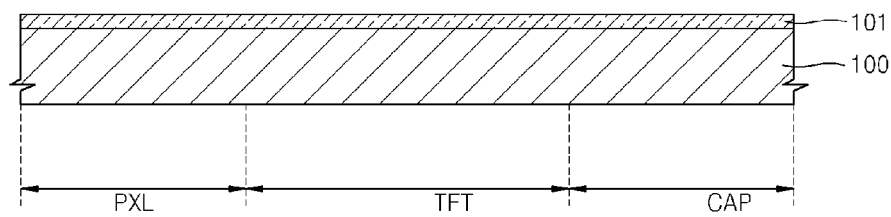
FIGS. 3 through 9 are schematic cross-sectional views illustrating an exemplary embodiment of a method of manufacturing the organic light emitting display device illustrated in FIG. 2 according to the invention.

FIG. 2 is an enlarged cross-sectional view of the organic light emitting display device 1 of FIG. 1 taken along line I-I' according to the invention.

Referring to FIG. 2, the organic light emitting display device 1 includes at least one TFT, at least one capacitor, and an organic light emitting diode ("OLED") electrically connected to the at least one TFT. The TFT, the capacitor and the OLED are respectively disposed in a TFT area TFT, a capacitor area CAP and a pixel area PXL.

The capacitor according to the illustrated exemplary embodiment of the invention includes a bottom electrode 112, an intermediate electrode 115 and a top electrode 116. According to the illustrated exemplary embodiment of the invention, the bottom electrode 112 includes an oxide semiconductor which is a conductor or conductive element. In detail, according to an exemplary embodiment of manufacturing the organic light emitting display device 1, hydrogen of a first insulation layer 103 diffuses into the bottom electrode 112 through an annealing process, and as a carrier density of the bottom electrode 112 increases accordingly, the bottom electrode 112 is formed to act as a conductor. Accordingly, the capacitor according to the illustrated exemplary embodiment of the invention further includes a sub-capacitor including the intermediate electrode 115 and the top electrode 116 as two electrodes thereof, in addition to a main capacitor including the bottom electrode 112 including the oxide semiconductor having conductor characteristics and the intermediate electrode 115 as two electrodes thereof.

The TFT according to the illustrated exemplary embodiment of the invention has a top gate structure in which an active layer 102 disposed in an oxide semiconductor pattern, a gate electrode 105 insulated from the active layer 102, and source and drain electrodes 106s and 106d that are insulated from the gate electrode 105 and contact the active layer 102 are sequentially disposed.

The active layer 102 including an oxide semiconductor includes source and drain areas 102s and 102d, and a channel area 102c. The active layer 102 of the TFT and the bottom electrode 112 of the capacitor are in and/or on a same layer of the organic light emitting display device 1. The source and drain areas 102s and 102d contact the source and drain electrodes 106s and 106d, respectively. In an exemplary embodiment of a method manufacturing the organic light emitting display device 1, with respect to the TFT of FIG. 2, as hydrogen is introduced into the source and drain areas 102s and 102d through annealing performed on the oxide semiconductor active layer 102, a carrier density of the active layer 102 increases so that the active layer 102 is formed to act as a conductor. Accordingly, as a portion of the active layer 102 of the TFT is formed to act as a conductor through the annealing process, even though the active layer 102 includes an oxide semiconductor, a TFT having a stable top-gate structure may be manufactured. Thus, even when an oxide semiconductor is used in the TFT and the capacitor of the organic thin film light emitting display device 1, a portion of an active layer area in the TFT functions as a conductor so that an organic thin film light emitting display devices has a small capacitance, a high aperture ratio, and stable characteristics may be manufactured.

In exemplary embodiments, a TFT in which an active layer includes an oxide semiconductor may have a bottom gate type structure or a top gate type structure. In a bottom gate structure, a gate electrode is disposed below an active layer, and in a top gate type structure, a gate electrode is disposed above an active layer. However, in a bottom gate type structure, a bottom electrode of a capacitor is disposed in and/or on the same layer as the active layer and permittivity of an oxide semiconductor of a capacitor area CAP is varied according to a gate bias.

Also, when a bottom gate type structure has a high parasitic capacitance and is used in a TFT included in a display device, power consumption may increase, an aperture ratio may be reduced and dead space may be increased to increase an overall thickness of the display device. Accordingly, a TFT included in a display device which reduces parasitic capacitance to achieve low power consumption and a high resolution may have a top gate structure.

Where a TFT includes an oxide semiconductor as an active layer, the oxide semiconductor has a higher effective mobility of charges than a silicon material, and thus an additional doping process is not necessary. However, as no doping process is performed, when a TFT having a top gate structure is formed, it may be difficult to distinguish source and drain areas from a channel area.

According to an exemplary embodiment of the invention, in a capacitor including a bottom electrode including an oxide semiconductor, a carrier density of an oxide semiconductor of a capacitor area CAP is increased by annealing to solve problems as described above.

FIGS. 3 through 9 are schematic cross-sectional views illustrating an exemplary embodiment of a method of manufacturing the organic light emitting display device 1 illustrated in FIG. 2 according to the invention. Hereinafter, the method of manufacturing the organic light emitting display device 1 illustrated in FIG. 2 will be briefly described.

First, a substrate 100 on which elements of the organic light emitting display device 1 is to be manufactured is prepared.

In detail, the substrate 100 may include a transparent glass material including $SiO_2$ as a main component. The substrate 100 is not limited thereto, and substrates of various materials such as a transparent plastic material or a metal may be used.

An auxiliary layer 101 such as a barrier layer, a blocking layer and/or a buffer layer may be formed (e.g., provided) on the substrate 10 in order to prevent diffusion of impurity ions, to prevent penetration of moisture or an external air, and to planarize a surface of the substrate 10. The auxiliary layer 101 may include $SiO_2$ and/or SiNx, and may be provided by using various deposition methods such as a plasma enhanced chemical vapor deposition ("PECVD") method, an atmospheric pressure CVD ("APCVD") method, or a low pressure CVD ("LPCVD") method.

Figure 4A:
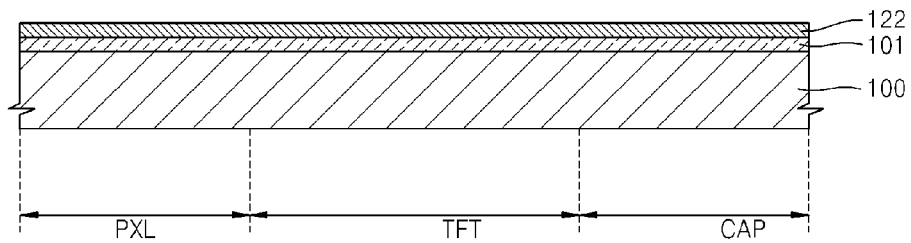

As illustrated in FIG. 4A, an oxide semiconductor material layer 122 is formed on an entire surface of the substrate 100.

An oxide semiconductor material may include at least one oxide selected from indium (In), gallium (Ga), stannum (Sn), zirconium (Zr), vanadium (V), hafnium (Hf), cadmium (Cd), germanium (Ge), chromium (Cr), titanium (Ti) and zinc (Zn), and a combination thereof. In one exemplary embodiment, for example, the oxide semiconductor may comprise Ga, In and Zn at an atomic ratio of 2:2:1. However, the oxide semiconductor is not limited thereto, and may comprise a quaternary metal oxide, such as an In—Sn—Ga—Zn—O-based material, a ternary metal oxide such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, or a Cd—Sn—O-based material, a binary metal oxide such as an In—Zn—O-based material, a Sn—Zn—O-based material, an Al—Zn—O-based material, a Zn—Mg—O-based material, a Sn—Mg—O-based material, or an In—Mg—O-based material, or an oxide of a single material such as an In—O-based material, a Sn—O-based material, a Zn—O-based material, a Ti—O-based material, or a Cd—O-based material. In the foregoing hyphenated formulas, the stoichiometry of each metal is not specified, thus, for example, an In—Ga—Zn—O-based oxide semiconductor refers to an oxide including at least In, Ga and Zn, and a composition ratio thereof is not limited. Also, the In—Ga—Zn—O-based oxide semiconductor may further include elements other than In, Ga and Zn.

A TFT including an oxide semiconductor as an active layer has a relatively high mobility compared to that of a silicon TFT according to the conventional art, and thus ion doping is not necessary to increase mobility. Also, an oxide semiconductor TFT has a polycrystalline or amorphous structure at a room temperature, and thus additional annealing is not necessary and the oxide semiconductor TFT may be manufactured at a relatively low temperature. Also, since an active layer may be formed by using a method such as a sputtering method, the oxide semiconductor TFT may be applied to a large substrate, such as for a display device. In addition, the price of a material of the oxide semiconductor TFT is relatively low.

Figure 4B:
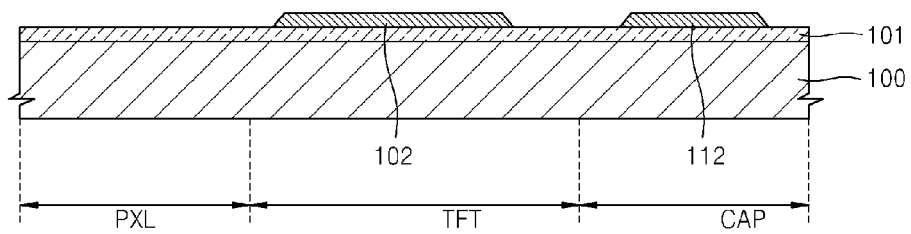

As illustrated in FIG. 4B, the oxide semiconductor material layer 122 is patterned such as by using a mask, thereby forming the active layer 102 and the bottom electrode 112. The active layer 102 is formed in the TFT area TFT, and the bottom electrode 112 is formed in the capacitor area CAP. The active layer 102 and the bottom electrode 112 include a same material and are disposed in a same layer of the organic light emitting display device.

Figure 5A:
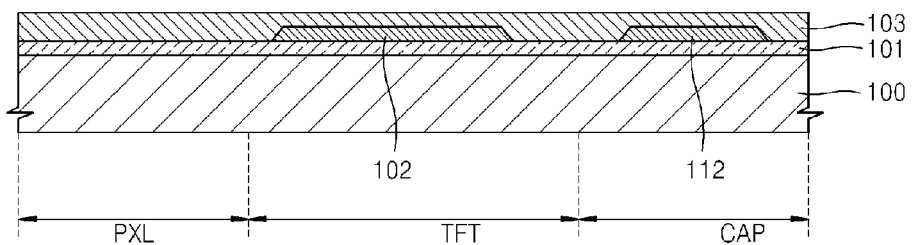

As illustrated in FIG. 5A, the first insulation layer 103 is coated on the entire surface of the substrate 100.

The first insulation layer 103 includes SiNx, and may be provided by using various deposition methods such as a PECVD method, an APCVD method, or a LPCVD method.

Figure 5B:
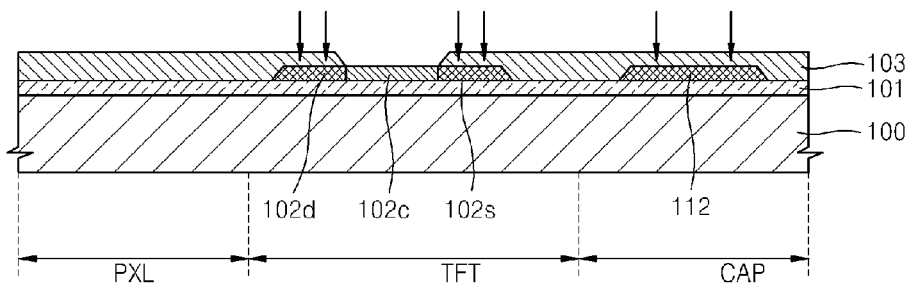

As illustrated in FIG. 5B, a portion of the first insulation layer 103 in the TFT area TFT is patterned by using a mask to remove the portion, and expose a portion of the active layer 102. A remaining portion of the active layer 102 and the bottom electrode 112 are formed to act as a conductor by using an annealing process (indicated by the downward arrows in FIG. 5B). As described above, the first insulation layer 103 includes SiNx, and when an annealing process is performed thereon, hydrogen of SiNx diffuses into the remaining portion of the active layer 102 and the bottom electrode 112, thereby applying conductor characteristics to the oxide semiconductor in the remaining portion of the active layer 102 and the bottom electrode 112.

An upper area of the active layer 102 where the first insulation layer 103 is disposed is the source and drain areas 102s and 102d, and a portion of the active layer 102 from which the first insulation layer 103 is removed becomes the channel area 102c. After the annealing process is performed, a carrier density of the source and drain areas 102s and 102d may increase so that the source and drain areas 102s and 102d may have conductor characteristics, and the channel area 102c may maintain intrinsic characteristics of an oxide semiconductor. Positions of the source and drain areas 102s and 102d may be respectively at opposing ends of the active layer 102.

With the first insulation layer 103 that remains in the capacitor area CAP, after the annealing process is performed, the bottom electrode 112 has an increased carrier density due to the hydrogen diffused from the first insulation layer 103 and also obtains characteristics of a conductor. Unlike an oxide semiconductor, capacitance of the capacitor including the bottom electrode 112 which has the characteristics of a conductor does not vary according to a gate bias. The source and drain areas 102s and 102d and the bottom electrode 112 may be formed to have the increased carrier density due to the hydrogen diffused from the first insulation layer 103 by a substantially same process (e.g., annealing the same oxide semiconductor layer) and/or at substantially a same time.

Figure 6:
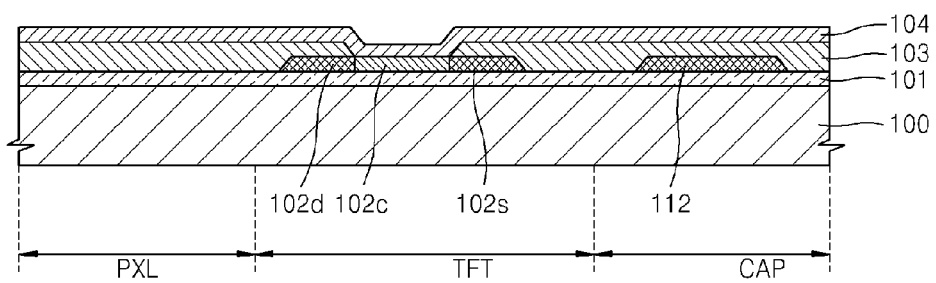

As illustrated in FIG. 6, a second insulation layer 104 is coated on the entire surface of the substrate 100.

The second insulation layer 104 insulates the active layer 102 of the TFT from the gate electrode 105 of the TFT (see FIG. 2), is disposed between the bottom electrode 112 and the intermediate electrode 115 (see FIG. 2) of the capacitor, and functions as a dielectric body. The second insulation layer 104 may include an inorganic insulation material selected from $SiO_2$, $Al_2O_3$, $CuOx$, $Tb_4O_7$, $Y_2O_3$, $Nb_2O_5$ and $Pr_2O_3$, and a combination thereof. The second insulation layer 104 may be provided by using various deposition methods such as a PECVD method, an APCVD method, or a LPCVD method.

In particular, the second insulation layer 104 is interposed between layers of the organic light emitting display device to contact the channel area 102c of the TFT area TFT so that a gate insulation material is also disposed in a portion where the first insulation layer 103 is removed by patterning and exposes the channel area 102c. As discussed above, the second insulation layer 104 is formed in the capacitor area CAP and functions as a dielectric body including a dielectric material.

Figure 7:
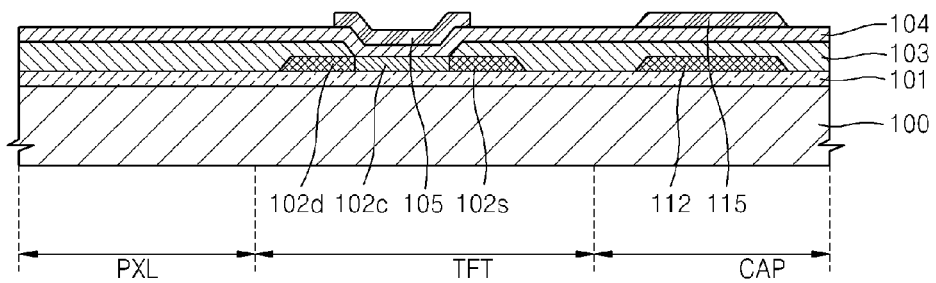

As illustrated in FIG. 7, the gate electrode 105 and the intermediate electrode 115 are formed. The gate electrode 105 and the intermediate electrode 115 are in and/or on a same layer of the organic light emitting display device and may include a same material.

To form the gate electrode 105 and the intermediate electrode 115, a conductive material (not shown) is formed on the entire surface of the substrate 100 and is patterned by using a mask to form the gate electrode 105 in the TFT area TFT and the intermediate electrode 115 in the capacitor area CAP. The gate electrode 105 is formed to overlap the channel area 102c of the active layer 102 of the TFT area TFT. The intermediate electrode 115 is formed to overlap the capacitor area CAP.

The gate electrode 105 and the intermediate electrode 115 may include a single conductive material layer or multiple conductive material layers including at least one material selected from silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), molybdenum (Mo), titanium (Ti), tungsten (W) and copper (Cu), and a combination thereof. The single or multiple conductive material layers may be formed on the second insulation layer 104 and patterned by using a mask.

Figure 8:
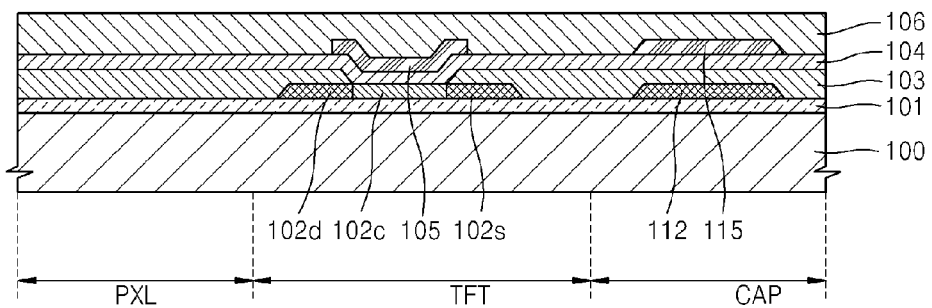

As illustrated in FIG. 8, an interlayer insulation layer 106 is formed on the entire surface of the substrate 100 to cover the gate electrode 105 and the intermediate electrode 115. A contact hole is formed in the interlayer insulation layer 106, the first insulation layer 103 and the second insulation layer 104 so as to expose the source and drain areas 102s and 102d of the active layer 102.

The interlayer insulation layer 106 includes at least one organic insulation material selected from polyimide, polyamide, an acrylic resin, benzocyclobutene and a phenolic resin, and a combination thereof. The interlayer insulation layer 106 may be provided by using a method such as a spin coating method. The interlayer insulation layer 106 may include not only an organic insulation material as described above, but also an inorganic insulation material selected from $SiO_2$, SiNx, $Al_2O_3$, $CuOx$, $Tb_4O_7$, $Y_2O_3$, $Nb_2O_5$, and $Pr_2O_3$, and a combination thereof.

Figure 9:
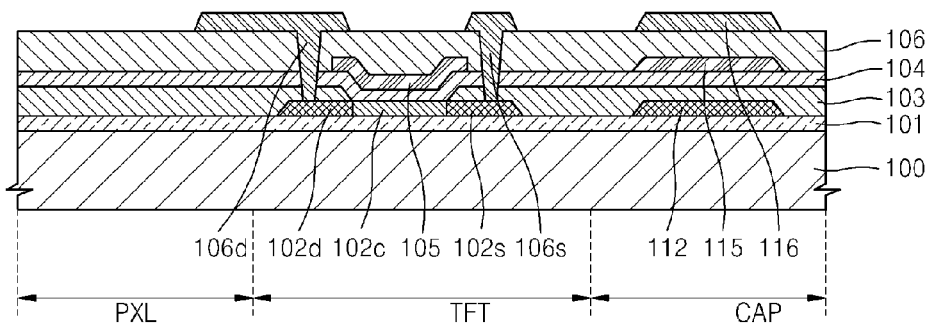

As illustrated in FIG. 9, source and drain electrodes 106s and 106d are formed to contact the source and drain areas 102s and 102d of the active layer 102 through the contact hole, respectively. In the capacitor area CAP, a top electrode 116 of the capacitor is formed on the interlayer insulation layer 106. The source and drain electrodes 106s and 106d and the top electrode 116 are in and/or on a same layer of the organic light emitting display device and may include a same material.

The source/drain electrodes 106s/106d and the top electrode 116 may include a single conductive material layer or multiple conductive material layers including at least one material selected from silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), molybdenum (Mo), titanium (Ti), tungsten (W) and copper (Cu), and a combination thereof. The single or multiple conductive material layers may be formed on the interlayer insulation layer 106 and patterned by using a mask.

Referring to FIG. 2 again, an OLED including a pixel electrode 111, an organic emissive layer 113 and an opposite electrode 121 is disposed on the source and drain electrodes 106s and 106d and the top electrode 116. The OLED may be disposed in the pixel area PXL.

In detail, a protection layer 107 is disposed on the source and drain electrodes 106s and 106d and the top electrode 116, and a via hole that exposes one of the source and drain electrodes 106s and 106d is defined in the protection layer 107. In an exemplary embodiment of a method manufacturing the organic light emitting display device 1, the via hole is formed by patterning the protection layer 107 by using a mask.

The protection layer 107 includes at least one organic insulation material selected from polyimide, polyamide, an acrylic resin, benzocyclobutene and a phenolic resin, and a combination thereof. In an exemplary embodiment of a method manufacturing the organic light emitting display device 1, the material of the protection layer 107 may be provided by using a method such as a spin coating method. A top surface of the protection layer 107 is planar so as to reduce or effectively prevent defects in the OLED.

An OLED is disposed on the protection layer 107 of the pixel area PXL. The OLED is defined by two electrodes, the pixel electrode 111 and the opposite electrode 121, and the organic emissive layer 113 including an organic light emitting material interposed between the two electrodes 111 and 121. The pixel electrode 111 may be used as an anode, and the opposite electrode 121 may be used as a cathode, or polarities of the electrodes may also be exchanged.

The pixel electrode 111 is disposed on the top surface of the protection layer 107, and is physically and/or electrically connected to a TFT through the via hole defined in the protection layer 107. The pixel electrode 111 may include various materials according to a type of light emission of the organic light emitting display device 1. In one exemplary embodiment, for example, in a bottom emission type organic light emitting display device in which an image is displayed only toward the substrate 100 or in a dual emission type organic light emitting display device in which an image is displayed both toward the substrate 100 and in an opposite direction to the substrate 100, the pixel electrode 111 includes a transparent metal oxide. The pixel electrode 111 may include at least one material selected from transparent conductive oxide ("TCO") materials such as indium tin oxide ("ITO"), indium zinc oxide ("IZO"), ZnO or $In_2O_3$. In a top emission type organic light emitting display device in which an image is displayed only in an opposite direction from the substrate 100, the pixel electrode 111 may further include a reflective electrode including a light-reflecting material.

The forming of the pixel defining layer 109, the organic emissive layer 113 and the opposite electrode 121 on the pixel electrode 111 will be further described with reference to FIG. 2.

In an exemplary embodiment of a method manufacturing the organic light emitting display device 1, the pixel defining layer 109 is formed on the entire surface of the pixel electrode 111, and an opening portion exposing the pixel electrode 111 to define a light emission unit is defined in the pixel defining layer 109.

The organic emissive layer 113 is formed on the pixel electrode 111 exposed through the opening portion. The organic emissive layer 113 may be a single layer or a multi-layer structure including an organic emissive layer ("EML") and at least one of functional layers such as a hole transport layer ("HTL"), a hole injection layer ("HIL"), an electron transport layer ("ETL"), and an electron injection layer ("EIL").

The opposite electrode 121 may be deposited on the entire surface of the substrate 100 as a common electrode. In an exemplary embodiment of a method manufacturing the organic light emitting display device 1, the opposite electrode 121 may be formed by depositing silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) and fluorinated lithium (LiF) or a combination of these, to a relatively small thickness. Also, the opposite electrode 121 may be a reflective electrode according to a direction of light emission in the organic light emitting display device 1, and may also be a semi-transparent electrode.

A capping layer (not shown) including an inorganic material may be further disposed on the opposite electrode 121 in order to protect the opposite electrode 121.

While the organic emissive layer 113 is individually disposed in the opening portion defined in the pixel defining layer 109 so that a light emitting material is disposed in each pixel of the organic light emitting display device 1 in the above-described exemplary embodiments, the exemplary embodiments of the invention are not limited thereto. The organic emissive layer 113 may be commonly disposed on the entire surface of the protection layer 107 regardless of positions of the pixels of the organic light emitting display device 1. In an exemplary embodiment of a method manufacturing the organic light emitting display device 1, the organic emissive layer 113 may be formed by sequentially stacking layers including a light emitting material that emits, for example, red, green or blue light, or by mixedly stacking layers including various different light emitting materials. Also, to emit white light, another color combination of layers may be provided. Also, a color conversion layer (not shown) for converting the emitted white light to a predetermined color or a color filter may be further included in the organic light emitting display device 1.

To protect the OLED disposed on the substrate 100 from the external moisture or air, an encapsulation layer (not shown) may be disposed on the entire surface of the substrate 100 to cover the OLED. The encapsulation layer may have a structure in which an organic layer and an inorganic layer are alternately stacked, or a structure including a monolayer including a low-melting point inorganic material.

Although a single TFT and a single capacitor are illustrated in the drawings for explaining the exemplary embodiments of the invention for convenience of description, the exemplary embodiments of the invention are not limited thereto. In one exemplary embodiment, for example, unless the number of mask processes according to the invention is not increased, a plurality of TFTs and/or a plurality of capacitors may be included.

According to an exemplary embodiment of the invention, as the OLED is included in the pixel area PXL, the organic light emitting display device 1 illustrated in FIG. 2 may be used as an organic light emitting display device. However, the exemplary embodiments of the invention are not limited thereto. In one exemplary embodiment, for example, by including liquid crystal between a pixel electrode and an opposite electrode, the organic light emitting display device 1 illustrated in FIG. 2 may be used as a liquid crystal display ("LCD") device.

According to one or more exemplary embodiment of the invention, an oxide semiconductor is disposed to act as a conductor in a capacitor including an electrode, and a conductive property is imparted to the oxide semiconductor in a manufacturing process such as by using annealing, thereby forming a capacitor including an electrode including an oxide semiconductor.

While the invention has been particularly shown and described with reference to exemplary embodiments thereof, it will be understood by those of ordinary skill in the art that various changes in form and details may be made therein without departing from the spirit and scope of the invention as defined by the following claims.

What is claimed is:

1. A method of manufacturing an organic light emitting display device, the method comprising:
providing a capacitor and a thin film transistor on a substrate;
providing a protection layer on the capacitor;
providing an organic light emitting diode on the protection layer; and
providing an encapsulation layer which encapsulates the organic light emitting diode,
wherein the providing the capacitor and the thin film transistor comprises:
providing a bottom electrode of the capacitor and an active layer of the thin film transistor, each comprising an oxide semiconductor, on the substrate;
providing a first insulation layer on the substrate, overlapping the capacitor bottom electrode and exposing a channel region of the thin film transistor active layer; and
with the first insulation layer overlapping the capacitor bottom electrode and exposing the thin film transistor active layer channel region, annealing the bottom electrode and the thin film transistor active layer, to increase a carrier density of the bottom electrode and a portion of the thin film transistor active layer.

2. The method of claim 1, wherein the annealing the bottom electrode and the portion of the thin film transistor active layer diffuses hydrogen of the first insulation layer into the bottom electrode and the portion of the thin film transistor active layer, to increase the carrier density of the bottom electrode and the portion of the thin film transistor active layer.

3. The method of claim 1, wherein the first insulation layer comprises SiNx.

4. The method of claim 1, further comprising providing a second insulation layer on the substrate comprising one selected from $SiO_2$, $Al_2O_3$, Copper Oxide, $Tb_4O_7$, $Y_2O_3$, $Nb_2O_5$ and $Pr_2O_3$, and a combination thereof.

5. The method of claim 1, wherein the providing the capacitor further comprises providing an intermediate electrode, on the first insulation layer and overlapping the bottom electrode, and after the providing the intermediate electrode:
providing a top electrode overlapping the intermediate electrode; and
providing an interlayer insulation layer between the intermediate electrode and the top electrode.

6. The method of claim 5, wherein the capacitor comprises:
a first sub-capacitor formed by the bottom electrode and the intermediate electrode, and
a second sub-capacitor formed by the intermediate electrode and the top electrode.

7. The method of claim 5, wherein the providing the intermediate electrode of the capacitor comprises forming a gate electrode of the thin film transistor.

8. The method of claim 5, wherein the providing the top electrode of the capacitor comprises forming source and drain electrodes of the thin film transistor.

* * * * *